(12) United States Patent
Twiss

(10) Patent No.: US 10,186,823 B2
(45) Date of Patent: Jan. 22, 2019

(54) APPARATUS FOR FACILITATING THE SEPARATION OF MATED PRINTED CIRCUIT BOARD ASSEMBLIES

(71) Applicant: Cisco Technology, Inc., San Jose, CA (US)

(72) Inventor: Robert Gregory Twiss, Chapel Hill, NC (US)

(73) Assignee: Cisco Technology, Inc., San Jose, CA (US)

( * ) Notice: Subject to any disclaimer, the term of this patent is extended or adjusted under 35 U.S.C. 154(b) by 381 days.

(21) Appl. No.: 15/000,689

(22) Filed: Jan. 19, 2016

(65) Prior Publication Data

US 2017/0207593 A1 Jul. 20, 2017

(51) Int. Cl.
- *B23P 19/00* (2006.01)
- *H01R 43/26* (2006.01)
- *H05K 3/36* (2006.01)

(52) U.S. Cl.
CPC .......... *H01R 43/26* (2013.01); *H05K 3/368* (2013.01); *H05K 2203/0182* (2013.01); *H05K 2203/0195* (2013.01); *H05K 2203/176* (2013.01); *Y10T 29/53274* (2015.01)

(58) Field of Classification Search
CPC ............ Y10T 29/53274; Y10T 137/36; Y10T 137/0396; Y10T 403/7066; A47C 27/082; H05K 2203/176; H05K 3/368

USPC ....... 29/762, 267, 268, 426.5, 764, 845, 877
See application file for complete search history.

(56) References Cited

U.S. PATENT DOCUMENTS

| | | | |
|---|---|---|---|
| 4,099,120 A * | 7/1978 | Aksu ................. | G01R 1/07328 324/72.5 |
| 5,152,052 A | 10/1992 | Rantala et al. | |
| 6,923,792 B2 | 8/2005 | Staid et al. | |
| 7,503,110 B2 | 3/2009 | Domitrovits et al. | |
| 7,992,289 B2 | 8/2011 | Cloer | |
| 9,736,968 B2 * | 8/2017 | Pawlowski ........ | H05K 7/20509 |

* cited by examiner

Primary Examiner — Thiem Phan
(74) Attorney, Agent, or Firm — P Su

(57) ABSTRACT

According to one aspect, an apparatus includes an expansion element, an expandable element, and a frame. The expandable element is configured to have an expanded state and an unexpanded state, wherein the expandable element is arranged to be inserted between a mated pair of printed circuit boards (PCBs) while in the unexpanded state. The expansion element is arranged to cause the expandable element to expand to the expanded state. When the expandable element is in the expanded state, the expandable element causes the pair of PCBs to demate. The frame is arranged to facilitate an insertion of the expandable element between the mated pair of PCBs. In one embodiment, the expandable element is an inflatable element and the expansion element is an inflator element that includes an air supply.

12 Claims, 7 Drawing Sheets

APPARATUS FOR FACILITATING THE SEPARATION OF MATED PRINTED CIRCUIT BOARD ASSEMBLIES

TECHNICAL FIELD

The disclosure relates generally to printed circuit board (PCB) assemblies. More particularly, the disclosure relates to an apparatus which allows mated PCB to be efficiently and safely separated.

BACKGROUND

Multi-layer printed circuit boards (PCBs) which are used in networking and/or telecommunications equipment typically include densely packed components. To increase functionality and to improve connectivity density into fixed dimensional confines generally associated with rack-mounted networking and/or telecommunications equipment, daughter card PCBs are often used in conjunction with motherboard or main PCBs. Daughter card PCBs are generally positioned over or under main PCBs, and rigidly attached to the main PCBs using standoff electrical connectors. A connector pair, which includes a connector mounted on a daughter card PCB and a connector mounted on a main PCB, is generally mated by snapping the connectors together to ensure a relatively strong board-to-board connection.

As interconnection density requirements for PCB assemblies increase, the use of multiple standoff connectors between a daughter card PCB and a main PCB is increasing. While using multiple board-to-board connections is generally beneficial, the use of multiple board-to-board connections renders it difficult to relatively quickly and relatively safely separate or demate daughter card PCBs from main PCBs.

BRIEF DESCRIPTION OF THE DRAWINGS

The disclosure will be readily understood by the following detailed description in conjunction with the accompanying drawings in which.

DESCRIPTION OF EXAMPLE EMBODIMENTS

General Overview

Figure 1:
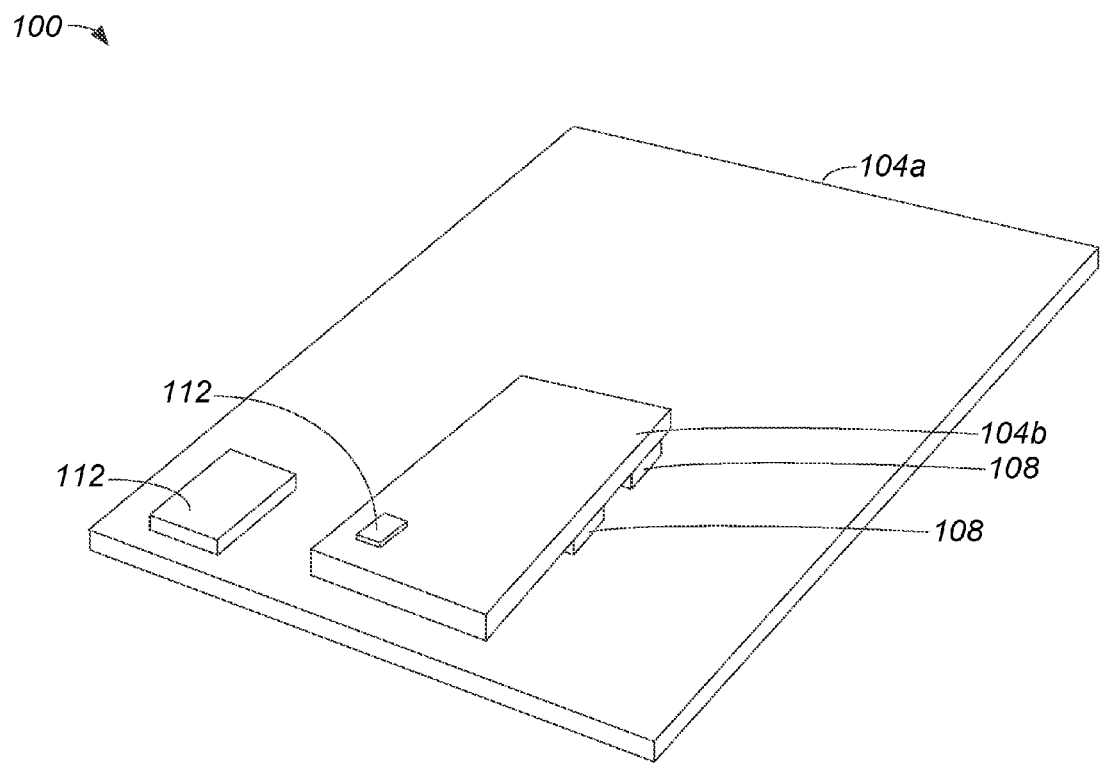
FIG. 1 is a diagrammatic representation of a printed circuit board (PCB) assembly that includes a main PCB and a daughter card PCB.

In one embodiment, an apparatus includes an expansion element, an expandable element, and a frame. The expandable element is configured to have an expanded state and an unexpanded state, wherein the expandable element is arranged to be inserted between a mated pair of printed circuit boards (PCBs) while in the unexpanded state. The expansion element is arranged to cause the expandable element to expand to the expanded state. When the expandable element is in the expanded state, the expandable element causes the pair of PCBs to demate. The frame is arranged to facilitate an insertion of, and may provide structural support to the expandable element between the mated pair of PCBs.

Description

As interconnect density requirement increase, printed circuit board (PCB) assemblies often include multiple board-to-board connectors, e.g., standoff connectors, used to secure daughter card PCBs and main PCBs. While the use of multiple board-to-board connectors to connect a daughter card PCB to a main PCB is beneficial in increasing the number of components that may be included in an overall PCB assembly, the use of multiple board-to-board connectors often renders it difficult to separate or to demate the daughter card PCB from the main PCB. As will be appreciated by those skilled in the art, the ability to separate a daughter card PCB from a main PCB may be needed to facilitate the inspection, testing, debugging, and/or replacement of one of the PCBs.

When a daughter card PCB and a main PCB are mated using multiple connectors, separating or demating the daughter card PCB from the main PCB may be difficult for a number of different reasons. The reasons may include, but are not limited to including, the need to overcome a relatively high board-to-board connector force, an inability to disconnect multiple connectors substantially simultaneously, a relatively tight alignment between board-to-board connectors, and the inaccessibility of a daughter card PCB due to positioning of the daughter card PCB on a main PCB.

Methods used to separate a daughter card PCB and a main PCB which are mated using multiple connectors generally involve an operating holding the main PCB down on a flat surface with one hand, and using his/her other hand to pull the daughter card PCB off of the main PCB. Such methods often introduce bending moment forces which may damage either the daughter card PCB or the main PCB, introduce forces which damage components on either the daughter card PCB or the main PCB, and/or may damage the connectors.

Utilizing a removal apparatus or demating device to demate connected or joined PCBs allows for the PCBs to be relatively quickly, safely, and efficiently demated. In one embodiment, a removal apparatus includes an expandable or inflatable portion which is arranged to be in a substantially deflated state for insertion between mated PCBs, and then arranged to be inflated to an inflated state to apply pressure and/or force that allows the mated PCBs to be demated. Such a removal apparatus may include a configurable tube assembly that is arranged to be inflated, as well as an inflator assembly which is arranged to inflate the tube assembly.

Referring initially to FIG. 1, a PCB assembly will be described. A PCB assembly 100 includes a main PCB 104a, e.g., a motherboard, and a daughter card PCB 104b, e.g., a secondary PCB. As will be appreciated by those skilled in the art, main PCB 104a may contain electronics, e.g., circuitry and other components, and may be mounted in an enclosure or a case (not shown). Both main PCB 104a and daughter card PCB 104b may include components such as integrated circuits (ICs) or chips 112.

Connectors 108 may be standoff connectors, and may be used to connect or mate main PCB 104a and daughter card PCB 104b. Typically, a plurality of connectors 108 may be used in PCB assembly 100 to substantially connect main PCB and daughter card PCB 104b. Connectors 108 may generally be any suitable connecting mechanism. Connectors 108 may include connecting mechanisms which each have a male portion that is configured to couple with a female portion. By way of example, connectors 108 may include male portions mounted on main PCB 104a and female portions mounted on daughter card PCB 104b which are configured to engage with each other.

In one embodiment, to facilitate the decoupling or demating of main PCB 104a and daughter card PCB 104b, a removal apparatus which includes an expandable, e.g., inflatable, portion may be used. The inflatable portion of the removal apparatus may be inserted, as for example in a deflated state, between main PCB 104a and daughter card PCB 104b. Inflating the inflatable portion of the removal apparatus allows the inflatable portion to apply force and/or pressure to main PCB 104a and daughter card PCB 104b, and eventually allows main PCB 104a and daughter card PCB 104b to demate.

Figure 2:
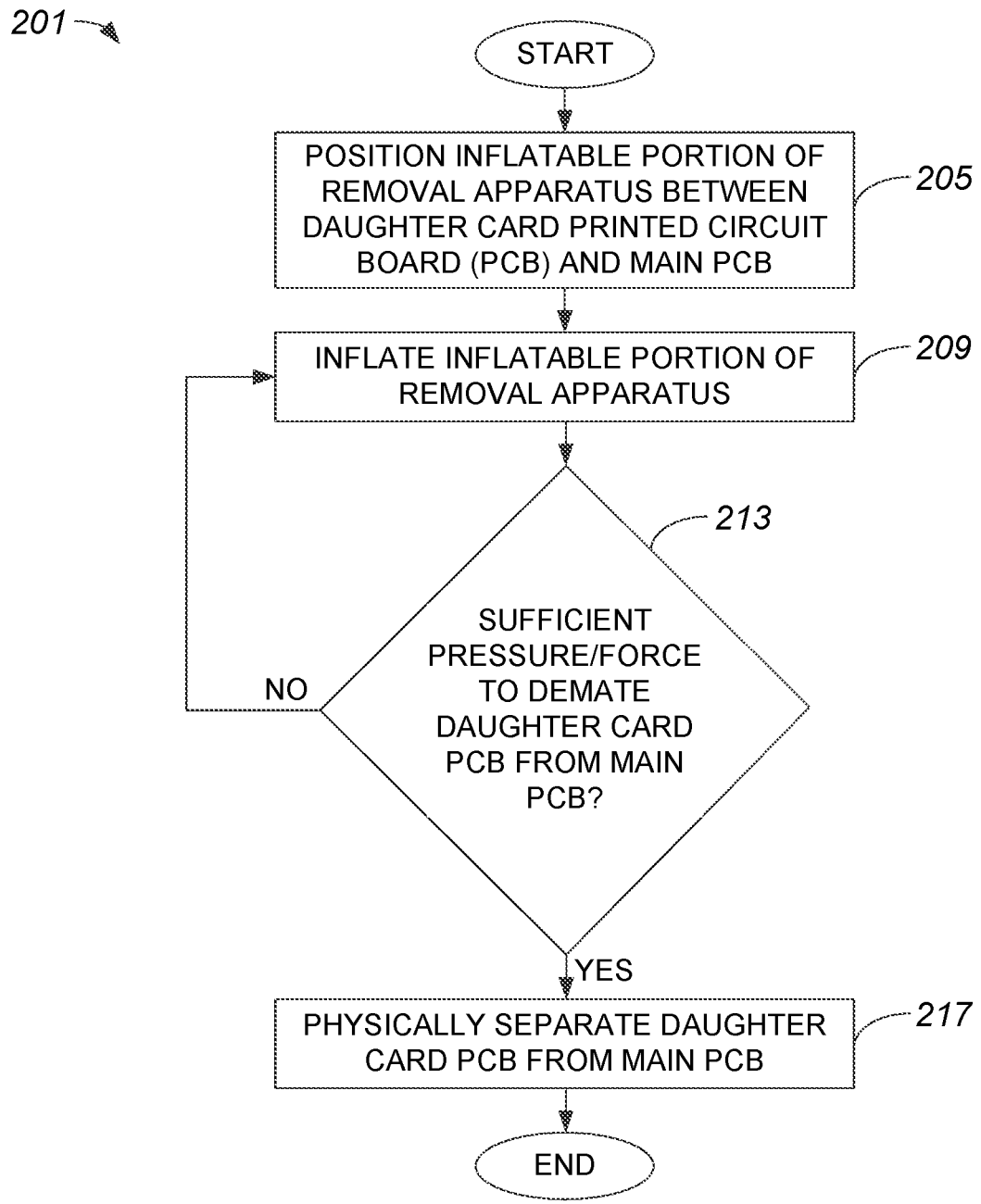
FIG. 2 is a process flow diagram which illustrates a method of separating or demating a main PCB and a daughter card PCB in accordance with an embodiment.

FIG. 2 is a process flow diagram which illustrates a method of separating or demating a main PCB and a daughter card PCB in accordance with an embodiment. A method 201 of separating or demating a main PCB and a daughter card PCB begins at step 205 in which an inflatable portion of a removal apparatus is effectively positioned between a main PCB and a daughter card PCB that are part of a PCB assembly. The removal apparatus, or demating device, will be described below with respect to FIGS. 5A, 5B, and 6.s In step 209, the inflatable portion of the removal apparatus is inflated. That is, a fluid or a gas, e.g., air, is supplied to the inflatable portion to cause the inflatable portion to inflate or otherwise expand. The inflatable portion may be inflated using any suitable gas supply, as for example air provided by a portable pressurized gas source. A determination is made in step 212 as to whether sufficient pressure and/or force is provided by the inflatable portion on surfaces of the main PCB and the daughter card PCB to cause the daughter card PCB to demate from the main PCB. It should be understood that the pressures and/or forces sufficient to cause connectors coupling the daughter card PCB to demate from the main PCB may vary widely depending upon, but not limited to depending upon, a connector type, an orientation of the connectors, and a number of mated connectors. For example, a sufficient pressure may be in the range of approximately ten pounds per square inch (psi) and approximately twenty psi.

If the determination in step 213 is that sufficient pressure and/or force has not been provided by the inflatable portion to cause the daughter card PCB to demate from the main PCB, then process flow returns to step 209 in which the inflatable portion of the removal apparatus continues to be inflated. Alternatively, if the determination in step 213 that sufficient pressure and/or force has been provided by the inflatable portion to cause the daughter card PCB to demate from the main PCB, the indication is that a connection between the daughter card PCB and the main PCB is effectively broken such that the daughter card PCB and the main PCB may be separated. Accordingly, process flow proceeds from step 213 to step 217 in which the daughter card PCB is physically separated from the main PCB. Once the daughter card PCB is physically separated from the main PCB, the method of separating or demating a main PCB and a daughter card PCB is completed.

Figure 3A:
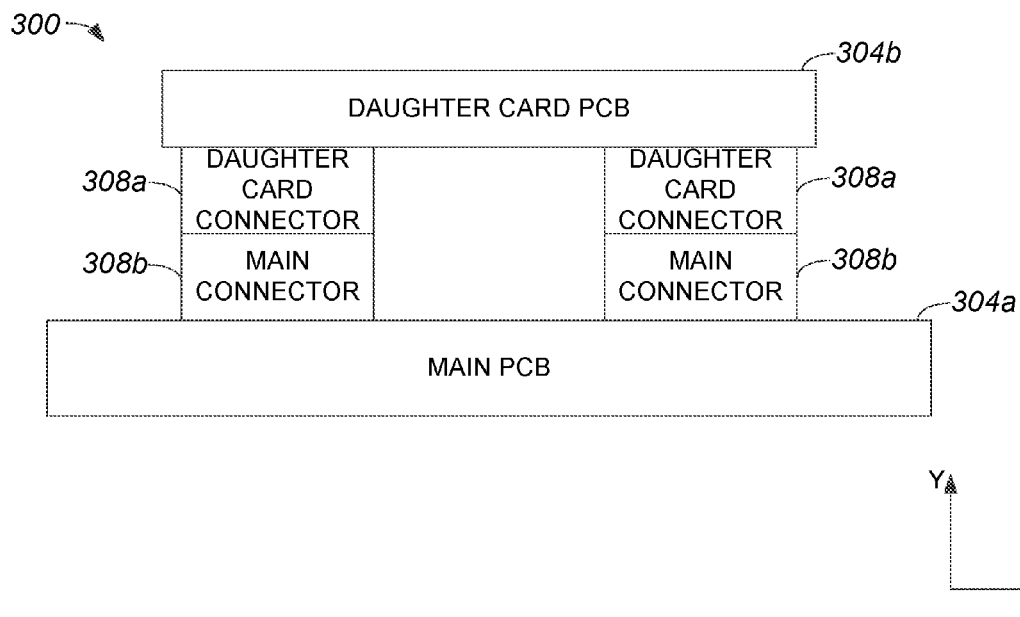
FIG. 3A is a block diagram representation of a PCB assembly that includes a main PCB and a daughter card PCB.

With reference to FIGS. 3A-D, the use of a removal apparatus which to facilitate the demating or separation of a daughter card PCB from a main PCB will be described in accordance with an embodiment. FIG. 3A is a block diagram representation of a PCB assembly that includes a main PCB and a daughter card PCB. A PCB assembly 300 includes a main PCB 304a and a daughter card PCB 304b. Daughter card PCB 304b has daughter card connectors 308a mounted thereon, and main PCB 304a has main connectors 308b mounted thereon. It should be appreciated that the number of daughter card connectors 308a mounted on daughter card PCB 304b and the number of main connectors 308b mounted on main PCB 304a. Each daughter card connector 308a and main connector 308b may effectively form a board-to-board connector pair in which daughter card connector 308a and main connector 308b are mated.

Within PCB assembly 300, daughter card PCB 304b is coupled to main PCB 304a through daughter card connectors 308a and main connectors 308b. As such, in order to separate daughter card PCB 304b from main PCB 304a, daughter card connectors 308a and main connectors 308b are effectively demated, or rendered into a state in which daughter card connectors 308a and main connectors 308b are no longer connected.

In one embodiment, daughter card connectors 308a may be female connectors while main connectors 308b may be male connectors. In another embodiment, daughter card connectors 308a may be male connectors while main connectors 308b may be female connectors. Alternatively, it should be appreciated that daughter card connectors 308a and main connectors 308b may generally be any suitable connectors that are arranged to interface with, e.g., to connect with or to mate with, each other.

Figure 3B:
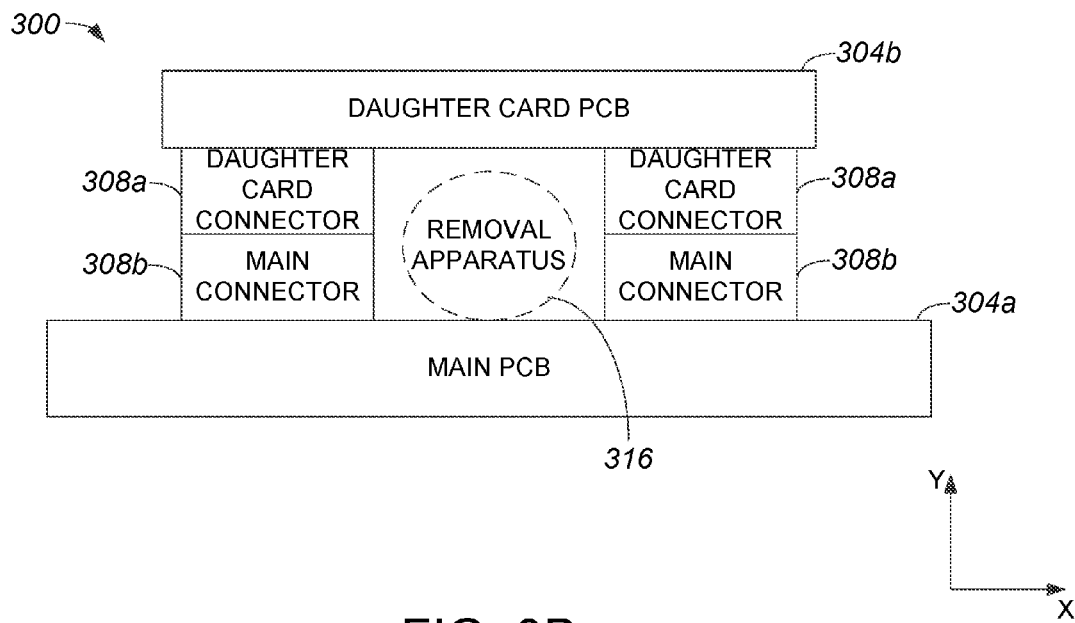
FIG. 3B is a block diagram representation of a PCB assembly, e.g., PCB assembly 300 of FIG. 3A, at a time t1 when a removal apparatus is positioned to demate a main PCB and a daughter card PCB in accordance with an embodiment.

At a time t1, a removal apparatus 316 is at least partially inserted between surfaces of daughter card PCB 304b and main PCB 304a, as shown in FIG. 3B. Removal apparatus 316, which generally includes an inflatable portion, may be at least partially positioned such that removal apparatus 316 is between surfaces of daughter card PCB 304b and main PCB 304a, and in proximity to connectors 308a, 308b which are to be decoupled or demated by removal apparatus 316. As shown, at time t1, removal apparatus 316 is in a substantially uninflated, or substantially unexpanded, state.

Figure 3C:
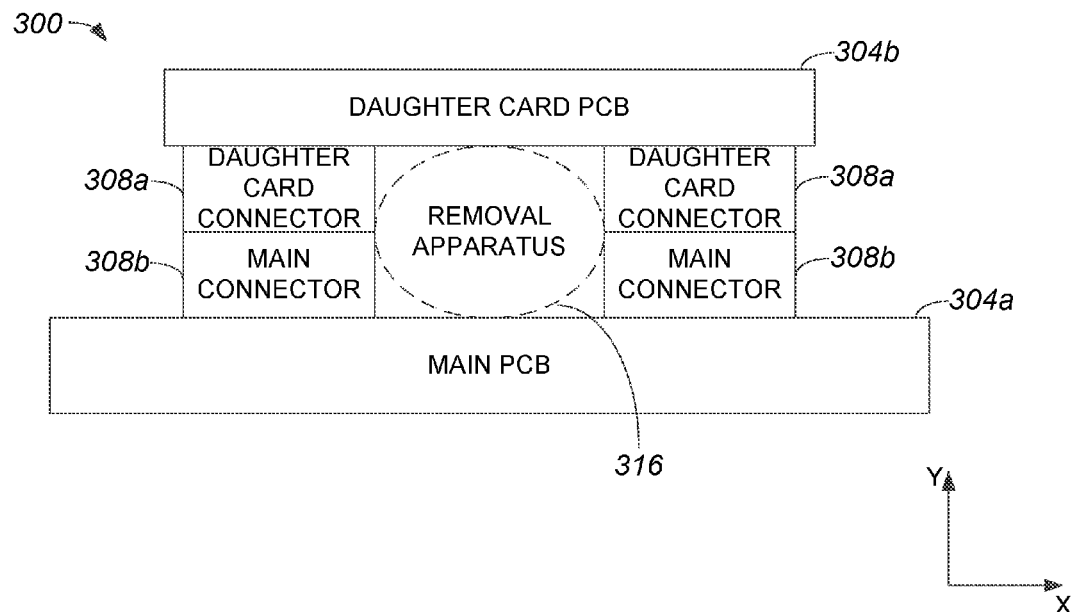
FIG. 3C is a block diagram representation of a PCB assembly, e.g., PCB assembly 300 of FIG. 3A, at a time t2 when a removal apparatus is inflated during a process to demate a main PCB and a daughter card PCB in accordance with an embodiment.

FIG. 3C shows PCB assembly 300 at a time t2 when removal apparatus 316 is inflated in accordance with an embodiment. When removal apparatus 316 is inflated, removal apparatus 316 is configured to apply pressure and/or force to surfaces of daughter card PCB 304*b* and main PCB 304*a*. It should be appreciated that although removal apparatus 316 is shown as also contacting connectors 308*a*, 308*b*, removal apparatus 316 does not necessarily come into contact with connectors 308*a*, 308*b* when removal apparatus 316 is in an inflated, or expanded, state.

Figure 3D:
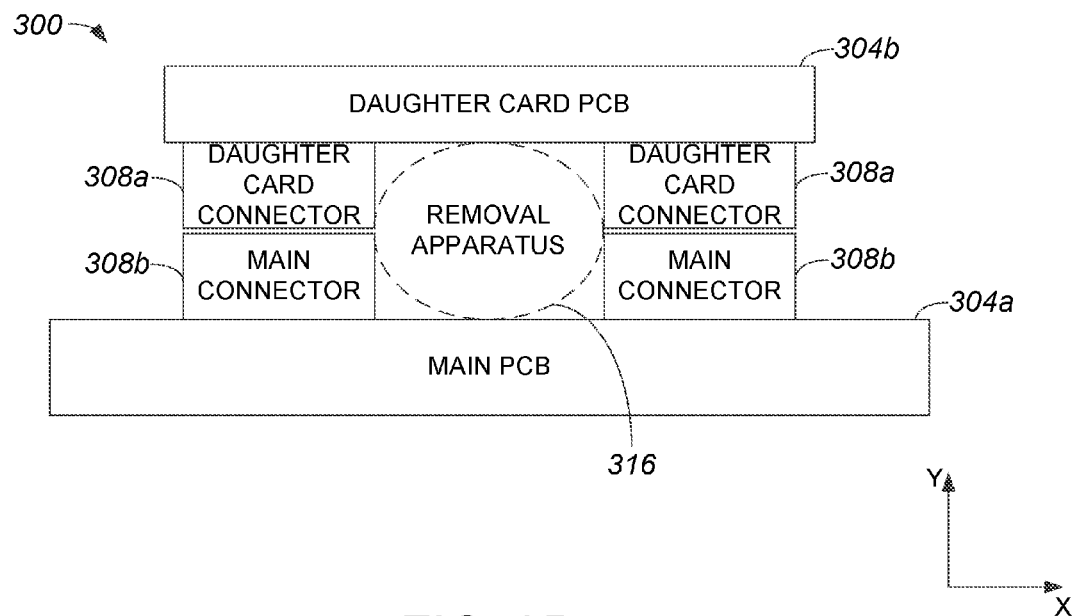
FIG. 3D is a block diagram representation of a PCB assembly, e.g., PCB assembly 300 of FIG. 3A, at a time t3 when a removal apparatus causes a main PCB and a daughter card PCB to demate in accordance with an embodiment.

FIG. 3D shows PCB assembly 300 at a time t3 when removal apparatus 316 is inflated to a point where pressure and/or force generated by removal apparatus 316 is sufficient to causes main PCB 304*a* and daughter card PCB 304*b* to demate in accordance with an embodiment. At time t3, removal apparatus 316 causes daughter card connectors 308*a* to demate from main connectors 308*b*. More generally, removal apparatus 316 is inflated to the point where a connection or a bond between connectors 308*a*, 308*b* is effectively broken or no longer intact. When connectors 308*a*, 308*b* are no longer connected to each other, then PCB assembly 300 may be readily disassembled by effectively separating main PCB 304*a* and daughter card PCB 304*b*.

Figure 4:
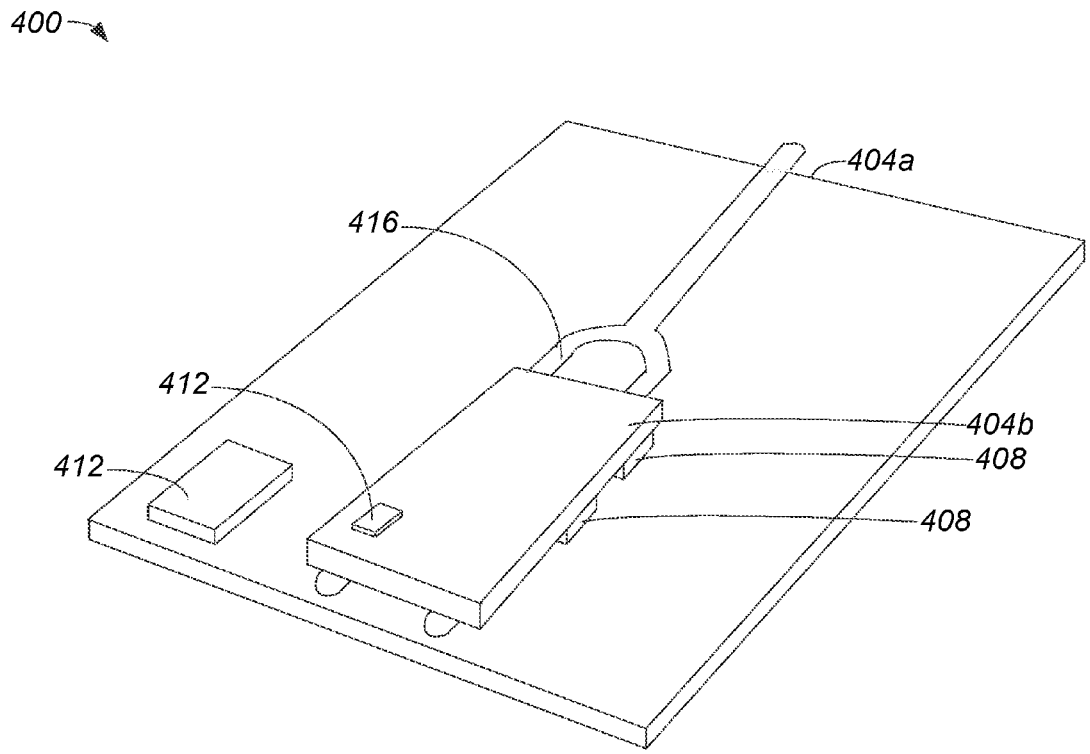
FIG. 4 is a diagrammatic representation of a PCB assembly in which a removal apparatus has been positioned between a main PCB and a daughter card PCB in accordance with an embodiment.

The size, shape, and configuration of a removal apparatus may vary widely. In one embodiment, a removal apparatus may include expandable, e.g., inflatable, portions configured to fit between a main PCB and a daughter card PCB. FIG. 4 is a diagrammatic representation of a PCB assembly in which a removal apparatus has been positioned between a main PCB and a daughter card PCB in accordance with an embodiment. A PCB assembly includes a main PCB 404*a* and a daughter card PCB 404*b* that are coupled through connectors 408. Main PCB 404*a* and daughter card PCB 404*b* may each include any number of components 412.

A removal apparatus 416 is positioned between a surface of daughter card PCB 404*b* and a surface of main PCB 404*a*, e.g., between a bottom surface of daughter card PCB 404*b* and a top surface of main PCB 404*a*. As shown, removal apparatus 416 has a plurality of prongs or appendages, e.g., two prongs or fingers. It should be appreciated that although removal apparatus 416 is shown as having two prongs which are arranged to be positioned between daughter card PCB 404*b* and main PCB 404*a*, the number and individual shape of prongs included in removal apparatus 416 may vary widely, and may have fewer than or more than two prongs.

Figure 5A:
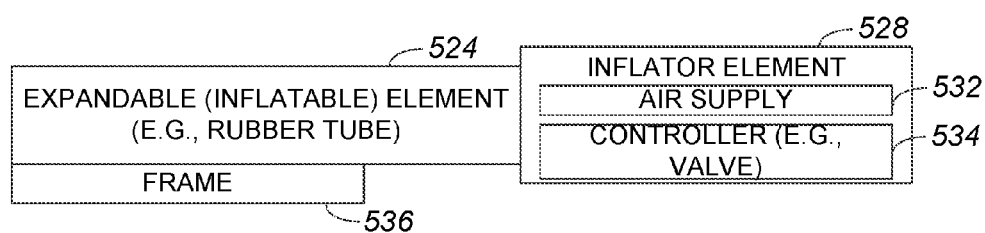
FIG. 5A is a block diagram representation of a removal apparatus in accordance with an embodiment.
Figure 5B:
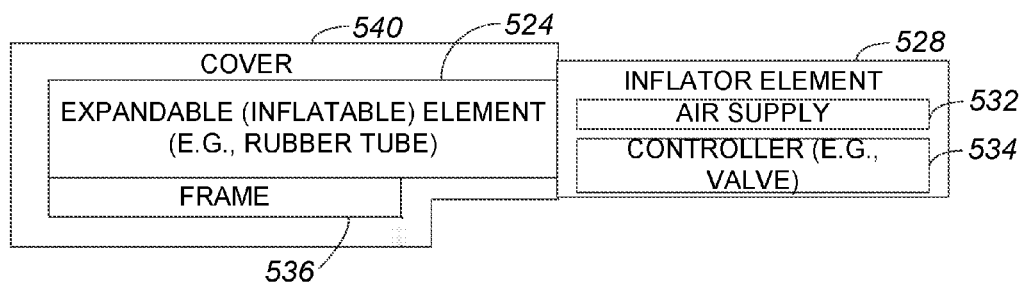
FIG. 5B is a block diagram representation of a removal apparatus, e.g., removal apparatus 516 of FIG. 5A, which includes a cover in accordance with an embodiment.

Referring next to FIGS. 5A and 5B, examples of removal apparatuses will be described. FIG. 5A is a block diagram representation of a removal apparatus or demating device in accordance with an embodiment. A removal apparatus 516 includes an expandable, as for example inflatable, element 524 and an expansion, or inflator, element 528 that is arranged to cause expandable element 524 to expand, as for example to inflate.

Inflatable element 524 may be formed from any suitable material that is flexible, and is configured to be substantially airtight. By way of example, inflatable element 524 may be formed from butyl rubber of a similar material. The size and overall shape of inflatable element 524 may vary depending upon factors including, but not limited to including, the intended application for removal apparatus 516. That is, the size and overall shape of inflatable element 524 may depend upon the number of connectors and/or the configuration of the connectors which are to be demated using removal apparatus 516. In one embodiment, inflatable element 524 includes at least one tube, e.g., inflatable element 524 may effectively be a tube assembly that includes one or more tubes.

Inflator element 528 generally includes an air supply 532 and a controller 534. Air supply 532 may be, but is not limited to being, a compressed air source such as a pressurized tank. Air supply 532 may also be a squeeze-ball type of pump which may be squeezed to provide air to inflatable element 524. Controller 534 may be, but is not limited to being, a valve which may be used to effectively control the flow of air or, more generally, gas between air supply 532 and inflatable element 524. Controller 534 may also be configured to enable inflatable element 524 to be deflated.

In one embodiment, air supply 532 may be associated with a portable pressurized gas source or air supply. For example, a carbon dioxide tank may be used, in conjunction with an inline pressure regulator, to effectively ensure that the pressurized gas source provides a safe and repeatable pressure to inflatable element 524.

A frame 536 is generally used to provide structure to inflatable element 524, e.g., to allow the shape of inflatable element to be substantially customized, and to facilitate the insertion of inflatable element 524 relative to a PCB assembly. Frame 536 generally provides structure, and may be particularly useful in helping to manage the geometry of the unexpanded inflatable element, and to provide a convenient, substantially repeatable geometry for situations in which a particular PCB configuration may be relatively frequently accessed. In one embodiment, frame 536 may be formed from metal, preferably a metal which would not cause conduction issues within the PCB assembly. For example, frame 536 may be formed from a substantially copper, form wire. The size and configuration of frame 536 may generally vary widely.

Frame 536 may be shaped or otherwise bent to substantially customize the shape associated with inflatable element 524. As inflatable element 524 may be substantially inserted into a PCB assembly in a deflated state or in a partially-inflated state, the use of frame 536 provides some form to inflatable element 524 to enable inflatable element 524 to be positioned between a daughter card PCB and a main PCB of a PCB assembly.

In one embodiment, removal apparatus 516 may include a cover which effectively covers inflatable element 524 and at least part of frame 536. FIG. 5B is a block diagram representation of removal apparatus 516, a shown with a cover. A removal apparatus 516' includes a cover 540 which may be formed from a conductive, elastic fabric that mitigates electrostatic discharge and provides protection for inflatable element 524. By forming cover 540 from a conductive fabric such as a thin, silver-impregnated, Lycra-like fabric, electrostatic discharge may be mitigated when the conductive fabric conducts and substantially dissipates static electrostatic charge that forms on non-conductive inflatable element 524. Cover 540 protects inflatable element 524 from coming into direct contact with PCB components, and reduces the likelihood that inflatable element 524 may be punctured by the PCB components.

Cover 540 may be fabricated such that fasteners may be used to enable cover 540 to be positioned over inflatable element 524. By way of example, a fastener such as Velcro may be used to join sides of cover 540 around inflatable element 524, while loose ends of cover 540 may be cinched together using fasteners such as zip ties or the like.

Figure 6:
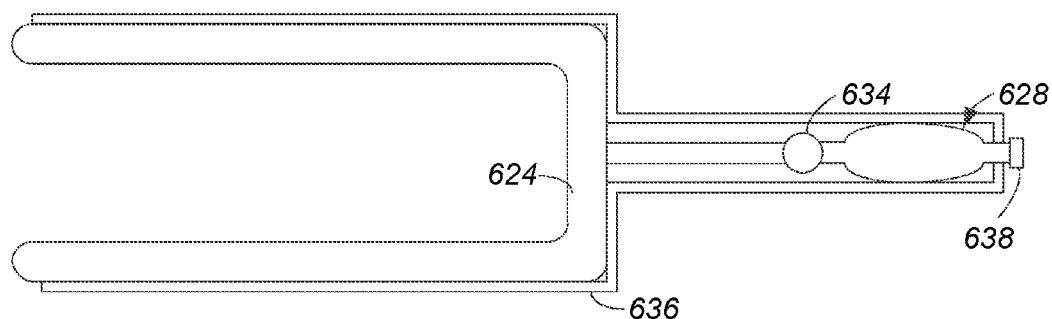
FIG. 6 is a diagrammatic representation of a removal apparatus in accordance with an embodiment.

As previously mentioned, the configuration of a removal apparatus or demating device may vary widely. FIG. 6 is a diagrammatic representation of a removal apparatus in accordance with an embodiment. A removal apparatus 616 includes an inflatable element 524, a frame 636, and an inflator element 628 which includes a valve 634.

Inflatable element 524 may effectively be a tube assembly that is coupled to frame 636. The tube assembly may include a plurality of tube sections, e.g., prongs or fingers. Frame 636 may be a relatively thin form wire, e.g., wire that is approximately one-eighth of an inch in diameter, although it should be appreciated that the configuration of frame 636 may vary widely. In one embodiment, frame 636 may be configured to substantially limit or prevent inflatable element 524 from coming in direct contact with adjacent connectors.

Inflator element 628 includes a valve 634 that is arranged to effectively control the volumetric flow and pressure of air from inflator element 628 to inflatable element 524. Inflator element 628 effectively includes an air supply (not shown) which may provide air, or gas, to inflatable element 524 through a coupler 638. Coupler 638 may generally allow an air supply (not shown) to be connected to inflator element 628.

Although only a few embodiments have been described in this disclosure, it should be understood that the disclosure may be embodied in many other specific forms without departing from the spirit or the scope of the present disclosure. By way of example, a removal apparatus has been described as having an inflatable portion that is used for applying pressure and/or force to PCBs to allow the PCBs to demate. In general, a removal apparatus may have an expandable portion that is used for applying pressure and/or force to PCBs. That is, a removal apparatus may have an expandable portion that may be expanded using any suitable method including, but not limited to including, inflation.

Once a daughter card PCB and a main PCB have been demated and, further, physically separated, it is typically desirable to deflate the inflatable element of a removal apparatus. In one embodiment, a pushbutton relieve valve may be included in a removal apparatus to facilitate relatively fast deflation of an inflatable element.

Connectors which are to be separated using a removal apparatus have generally been described as including one standoff connector, or a portion of an overall connector, mounted on a daughter card PCB and another standoff connector, or another portion of the overall connector, mounted on a main PCB, which may be mated. As described above, a male portion of one connector or connector portion may be physically coupled to a female portion of another connector or connector portion. It should be appreciated that in lieu of utilizing male and female connections, connectors may be coupled using any suitable mechanism or method. For example, connectors may be coupled using magnets or the like without departing from the spirit or the scope of the disclosure.

While connectors have been described as being mounted on PCBs, it should be appreciated that in some embodiments, connectors may effectively be integrated into PCBs rather than mounted on PCBs. For instance, in one embodiment, one PCB may have an opening defined therein into which a protrusion of another PCB is to fit to form a connection. In such an embodiment, the "connector" on one PCB may be a receptacle or opening in the PCB, and the "connector" on the other PCB may be a protrusion mounted on or otherwise associated with the other PCB.

A frame is often used to provide structure to a removal apparatus, specifically to provide structure to an inflator element such that the inflator element may be readily positioned within a PCB assembly. It should be appreciated, however, that the use of a frame is optional. That is, a removal apparatus may include an inflatable element without a frame.

In one embodiment, an inflator element used to inflate an inflatable element of a removal apparatus includes a common inflation point, or a junction through which different sections of the inflatable element are inflated. The common inflation point may generally be located between a controller and an inflatable element.

An inflator element may provide air substantially directly to an inflatable element through a controller such as a valve. It should be appreciated, however, that an inflator element may also provide air through other components of a removal apparatus, in addition to a controller. For example, an inflator element may provide air to an inflatable element through intermediate components including, but not limited to including, tubing and a manifold.

A removal apparatus has generally been described as including one or more tubes or fingers, e.g., as shown in FIG. 6. In addition to the number of tubes varying, it should be understood that the size and shape of the tubes may also vary. The number, size, and shape of tubes included in a removal apparatus may vary depending upon factors including, but not limited to including, the geometry of a PCB assembly that has a daughter card PCB that is to be separated from a main PCB.

The steps associated with the methods of the present disclosure may vary widely. Steps may be added, removed, altered, combined, and reordered without departing from the spirit of the scope of the present disclosure. Therefore, the present examples are to be considered as illustrative and not restrictive, and the examples is not to be limited to the details given herein, but may be modified within the scope of the appended claims.

What is claimed is:

1. An apparatus comprising:
an expansion element;
an expandable element, the expandable element configured to have an expanded state and an unexpanded state, wherein the expandable element is arranged to be inserted between a mated pair of printed circuit boards (PCBs) while in the unexpanded state, the expansion element being arranged to cause the expandable element to expand to the expanded state, wherein when the expandable element is in the expanded state, the expandable element causes the pair of PCBs to demate; and
a frame, the frame being arranged to facilitate an insertion of the expandable element between the mated pair of PCBs.

2. The apparatus of claim 1 wherein the expansion element is an inflator element, and wherein the expandable element is an inflatable element.

3. The apparatus of claim 2 wherein the inflator element includes an air supply and a controller, the controller being arranged to control a flow of air from the air supply into the inflatable element.

4. The apparatus of claim 2 wherein the pair of PCBs includes a daughter card PCB and a main PCB, the daughter card PCB including at least a first daughter card connector, the main PCB including at least a first main connector, and wherein the first daughter card connector and the first main connector are mated when the daughter card PCB and the main PCB are the mated pair.

5. The apparatus of claim 4 wherein the inflatable element is configured to be inserted between the daughter card PCB and the main PCB in the unexpanded state.

6. The apparatus of claim 4 wherein the inflator element includes an air supply and a controller, the controller being arranged to control a flow of air from the air supply into the inflatable element to enable the inflatable element to exert a first amount of pressure on the daughter card PCB and the main PCB, the first amount of pressure being arranged to cause the first daughter card connector and the main connector to demate.

7. The apparatus of claim 4 wherein the inflator element includes an air supply and a controller, the controller being arranged to control a flow of air from the air supply into the inflatable element to enable the inflatable element to exert a first amount of force on the daughter card PCB and the main PCB, the first amount of force being arranged to cause the first daughter card connector and the main connector to demate.

8. The apparatus of claim 2 wherein the frame is a form wire and the inflatable element includes a rubber tube.

9. The apparatus of claim 8 further including:
a cover, the cover being arranged to dissipate static electrostatic charge formed on the inflatable element, wherein the cover is arranged to cover the inflatable element and at least a portion of the frame.

10. An apparatus for demating a daughter card printed circuit board (PCB) and a main PCB, the daughter card PCB and the main PCB being a part of a PCB assembly, the apparatus comprising:
a tube assembly, the tube assembly including a plurality of tube sections configured to be inserted between a first surface of the daughter card PCB and a first surface of the main PCB, the tube sections being arranged to be in a deflated state when being inserted between the first surface of the daughter card PCB and the first surface of the main PCB, the tube sections being arranged to be in an inflated state when being used to demate the daughter card PCB and the main PCB; and
an inflator assembly, the inflator assembly being configured to provide air to the tube assembly to cause the tube sections to be in the inflated state when the tube sections are used to demate the daughter card PCB and the main PCB.

11. The apparatus of claim 10 wherein the daughter card PCB has a plurality of daughter card connectors and the main PCB has a plurality of main connectors, the plurality of daughter card connectors being mated to the plurality of main connectors in the PCB assembly, and wherein when the tube sections are in the inflated state, the tube sections are arranged to apply at least one selected from a group including a force and a pressure to cause the plurality of daughter card connectors to demate from the plurality of main connectors.

12. The apparatus of claim 10 further including:
a frame, the frame being coupled to the tube assembly; and
a cover, the cover being configured to dissipate static electrostatic discharge formed on the tube sections, the cover being arranged over the tube sections.

* * * * *